(12) United States Patent
Gutierrez-Aitken

(10) Patent No.: US 6,567,457 B1
(45) Date of Patent: May 20, 2003

(54) MONOLITHIC LIGHT REFLECTOR

(75) Inventor: Augusto L. Gutierrez-Aitken, Redondo Beach, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 57 days.

(21) Appl. No.: 09/709,027

(22) Filed: Nov. 8, 2000

(51) Int. Cl.[7] .............................. H01S 3/08; H01S 5/00
(52) U.S. Cl. ............................................ 372/108; 372/50
(58) Field of Search ........................... 372/99, 36, 107, 372/108, 96, 44, 45–46, 50; 257/88

(56) References Cited

U.S. PATENT DOCUMENTS

| | | | | |
|---|---|---|---|---|
| 3,996,492 A | * | 12/1976 | McGroddy | 372/44 |
| 4,718,070 A | * | 1/1988 | Liau et al. | 372/50 |
| 5,331,658 A | * | 7/1994 | Shieh et al. | 372/50 |
| 5,343,542 A | * | 8/1994 | Kash et al. | 385/31 |
| 5,365,534 A | * | 11/1994 | Janssen et al. | 372/36 |
| 5,606,181 A | * | 2/1997 | Sakuma et al. | 257/88 |

* cited by examiner

Primary Examiner—Quyen Leung
(74) Attorney, Agent, or Firm—McAndrews, Held & Malloy, Ltd.

(57) ABSTRACT

An optical semiconductor device (100) includes an optical semiconductor structure (120) and a light reflector (110) monolithic with the optical semiconductor structure (120). The light reflector (110) is disposed to direct light to and/or from the optical semiconductor structure (120).

17 Claims, 3 Drawing Sheets

MONOLITHIC LIGHT REFLECTOR

BACKGROUND OF THE INVENTION

The present invention relates generally to optical semiconductor devices and more specifically to optical semiconductor devices including light reflectors.

Most optical electronic circuits use fiber-optic cables to channel light between communicating entities. As an interface to transmit/receive electronics, a fiber-optic cable may channel light to an optical semiconductor structure within a semiconductor device casing. The fiber-optic cable may enter the semiconductor device casing from the top (vertically) or from the side (laterally), although lateral entry is generally preferable since it requires less complex supporting structures for the fiber-optic cables. In addition, laterally-entering cables may use a smaller vertical profile than vertically-entering cables and are generally more mechanically stable than vertically-entering cables.

On the other hand, top-interfaced (or vertically-interfaced) optical semiconductor devices are generally easier and less costly to fabricate than laterally-interfaced optical semiconductor devices. Therefore, prior efforts have attempted to use reflection mechanisms to interface laterally-entering fiber-optic cables with vertically-illuminated optical semiconductor devices. However, the prior efforts have not provided a robust, cost-effective, and highly manufacturable vertically-illuminated optical semiconductor device that may be laterally interfaced.

For example, one prior effort included fabricating a vertically-illuminated optical semiconductor device on a first substrate and fabricating light reflectors on a second substrate. The second substrate was then flipped and mounted to the first substrate. However, such a construction had many problems. Not only was the fabrication process for the device complicated, but the fine structures had to be fabricated on separate substrates, aligned, and attached. The mechanical alignment process was subject to alignment errors and the stacked substrates also caused the resultant device to be bulky. In addition, valuable real-estate on the substrate was typically occupied by solder bumps.

Another prior effort fabricated a vertically-illuminated semiconductor structure and a separate base structure. Then the vertically-illuminated semiconductor was mounted to the base structure on its side using a submount. This solution was complicated to manufacture because it involved processing two separate substrates and coupling the substrates orthogonally. Electrically connecting the substrates was also difficult because most connecting apparatus are designed to connect substrates that have substantially parallel planes. In addition, the solution was also vertically bulky.

Yet another past device used fiber-optic cable polished at a 45-degree angle and coated with a reflective material so that light passed out of the cable at an angle. However this device required a cable manufacturing process external to the fabrication of the semiconductor device. Thus, this device potentially places the burden on the user of the semiconductor device to specially prepare and/or align the fiber-optic cables. In addition, this solution is highly dependent on precise and difficult to achieve alignment of the fiber-optic cable with the device.

Thus, a need has long existed for an optical semiconductor device that overcomes the disadvantages noted above and others previously experienced.

SUMMARY OF THE INVENTION

A preferred embodiment of the present invention provides an optical semiconductor device. The optical semiconductor device includes a top-interfaced optical semiconductor structure and a light reflector monolithic with the optical semiconductor structure. The light reflector is disposed to direct light between the optical fiber and the optical semiconductor structure. The optical semiconductor structure may be, for example, a top-illuminated PIN photodiode. The light reflector may then, for example, direct the horizontal interface light from the fiber to the top surface of the top-illuminated PIN photodiode.

Another preferred embodiment of the present invention provides a method for fabricating an optical semiconductor device. The method includes fabricating an optical semiconductor structure, which may, for example, result in a top-illuminated PIN photodiode. The method also includes fabricating a light reflector monolithic with the optical semiconductor structure. Fabricating a light reflector may, for example, fabricate a dielectric support structure monolithic with the optical semiconductor structure and fabricate a substantially quarter-spherical metallic reflective surface adjacent to the light reflector support structure. Fabricating the light reflector may include disposing and shaping the light reflector to direct light to the top surface of the optical semiconductor structure.

DETAILED DESCRIPTION OF THE PREFERRED EMBODIMENT

Figure 1:
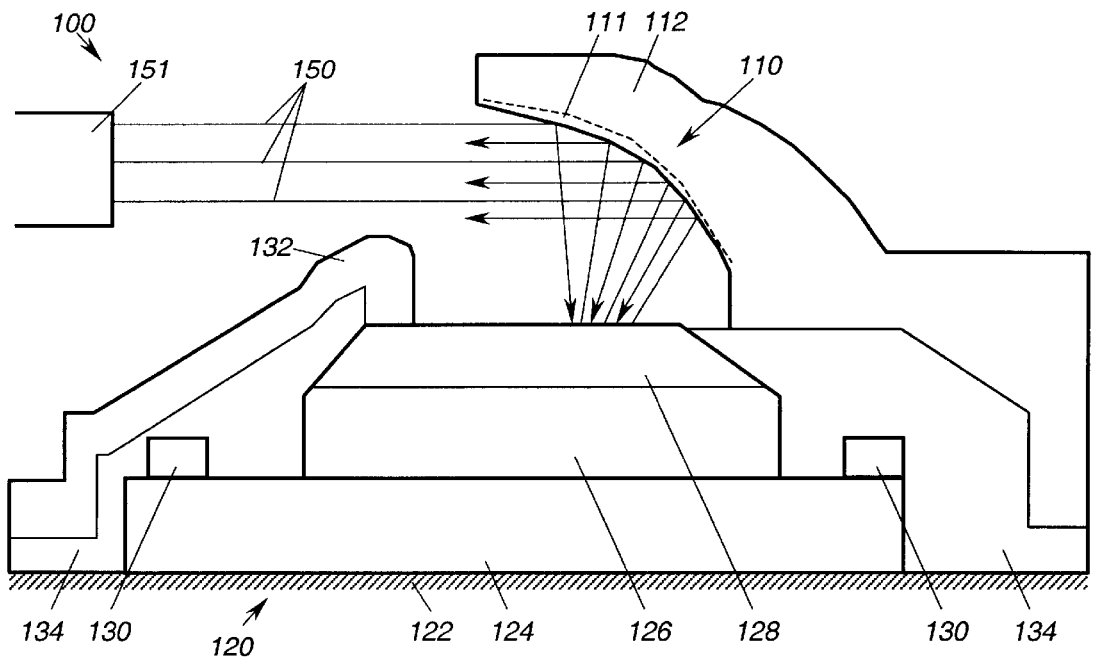
FIG. 1 illustrates a side view of an optical semiconductor device including a monolithic light reflector.
Figure 2:
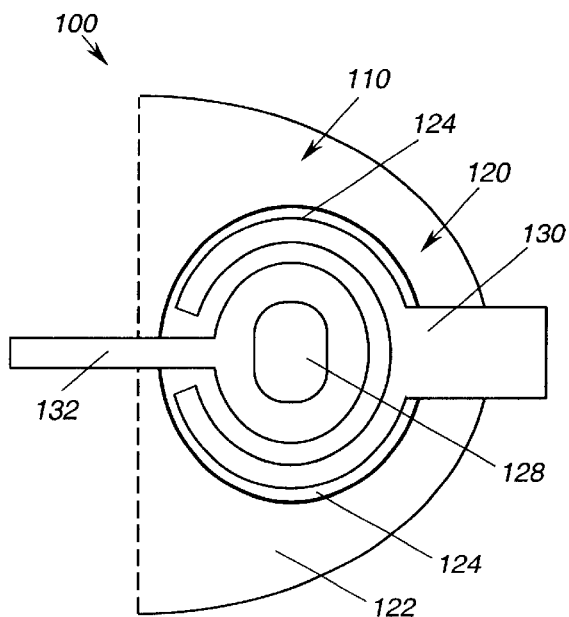
FIG. 2 shows a top view of the optical semiconductor device illustrated in FIG. 1.

FIG. 1 illustrates a side view of an optical semiconductor device 100, and FIG. 2 shows a top view of the optical semiconductor device 100. As shown, the optical semiconductor device 100 is shaped quarter-spherically (or half semi-spherically). The optical semiconductor device 100 includes an optical semiconductor structure 120 and a light reflector 110 monolithic with the optical semiconductor structure 120. In other words, the light reflector 110 and the semiconductor structure 120 are fabricated on the same substrate.

The light reflector 110 includes a reflective surface 111. The reflective surface 111 may be, for example, a metallic surface. The light reflector 110 also includes a support structure 112 that supports the reflective surface 111. The support structure 112 may be, for example, a metal material. The light reflector 110 is shaped and oriented as shown to direct light 150 to and from the optical semiconductor structure 120.

The optical semiconductor structure 120 includes a substrate 122 supporting an N+ contact layer 124. The optical semiconductor structure 120 also includes an absorption region 126 adjacent to the N+ contact layer 124 and a P+ contact layer 128 adjacent to the absorption region 126. An N ohmic contact 130 is disposed on the N+ contact layer 124, and a P contact 132 is disposed on the P+ contact layer 128. The optical semiconductor structure 120 further includes a dielectric passivation layer 134 disposed about the active semiconductor regions 124, 126, 128.

The optical semiconductor structure 120 illustrated in FIGS. 1 and 2 is a top-illuminated optical semiconductor structure including semiconductor layers 124, 126, 128 fabricated on top of one another in a mesa-structure topology. As a top-illuminated optical semiconductor structure, the optical semiconductor structure 120 performs best when receiving light from the top (approximately orthogonal to the top surface of the top-illuminated optical semiconductor structure).

The optical semiconductor structure 120 shown in FIGS. 1 and 2 is a top-illuminated PIN photodiode, which includes the absorption region 126 disposed between the P+ contact layer 128 and the N+ contact layer 124. Electric charge carriers are photogenerated in he absorption region 126 and flow to the P+ contact layer 128 and the N+ contact layer 124. The amount of photocurrent generated in the absorption region 126 depends on the amount of light energy absorbed by the absorption region 126. The amount of light energy absorbed by the absorption region, in turn, depends on the amount of light that penetrates the P+ contact layer 128. The P+ contact layer 128 is a relatively thin and substantially planar semiconductor layer that passes light readily when the light is directed orthogonally to the P+ contact layer 128. Alternate embodiments include optical semiconductor structures 120 that implement PNP or NPN phototransistors, laser diodes, and other photo-structures.

To direct light received by the optical semiconductor device 100 to the substantially planar P+ contact layer 128, the optical semiconductor device 100 includes the light reflector 110. As the optical semiconductor device 100 receives light 150, the light reflector 110 directs the light 150 to the top surface of the P+ contact layer 128. The light reflector 110 may further be shaped to focus light 150 received from a plurality of angles to the top surface of the P+ contact layer 128. As shown in one embodiment in FIG. 2, the light reflector 110 thus enables the optical semiconductor device 100 to be robust with respect to the angle at which light 150 enters the optical semiconductor device 100. Note that the light 150 may be received by or transmitted by the optical fiber 151, which thereby servers as a data port.

The light reflector 110 may include a metallic reflective surface 111 that is shaped substantially quarter-spherically. The light reflector 110 may be shaped and oriented not only to direct this light 150, but to focus the light 150 on the P+ contact layer 128. Such focusing allows for a reduced-size optical semiconductor structure 120 to be incorporated in the optical semiconductor device 110.

The light reflector 110 may also direct light out of an optical semiconductor structure. For example the light reflector 110 may be used in a vertically emitting laser diode based optical transmitter.

Figure 3:
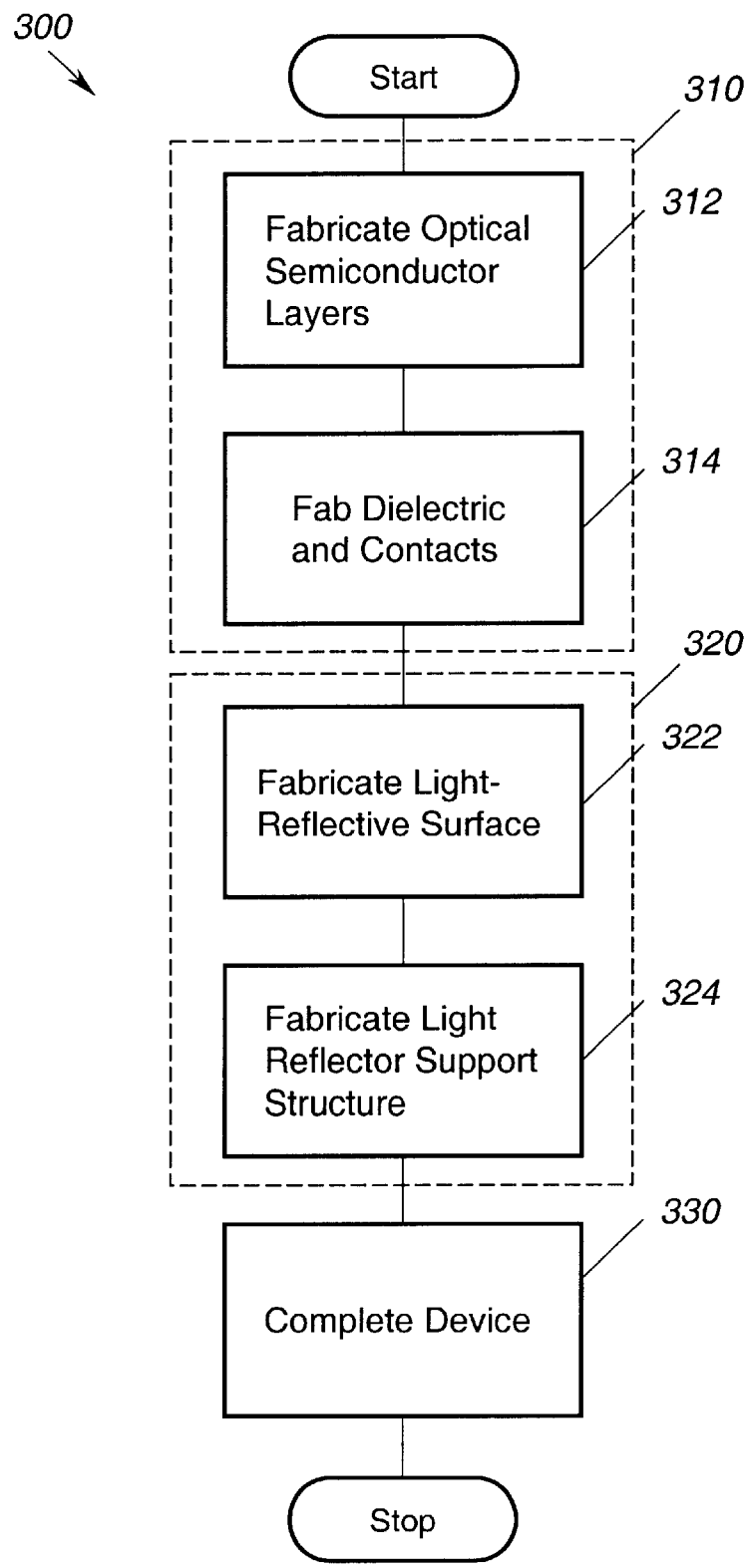
FIG. 3 illustrates a method for fabricating an optical semiconductor device.

Referring now to FIG. 3, that figure illustrates a method 300 for fabricating an optical semiconductor device. The method 300 generally includes fabricating 310 an optical semiconductor structure and fabricating 320 a light reflector monolithic with the optical semiconductor structure to couple light between the optical semiconductor structure and the light reflector. The method 300 then includes completing fabrication 330 of the optical semiconductor device, for example as a PIN photodiode, phototransistor, laser diode, and the like.

In particular, the fabrication step 310 includes fabricating 312 optical semiconductor layers and fabricating 314 a dielectric layer and contacts, for example, as a top-interfaced optical semiconductor structure. Fabricating 320 a light reflector generally includes fabricating 322 a light-reflective surface monolithic with the optical semiconductor structure, for example, as a substantially quarter-spherical and metallic light-reflective surface. Fabricating 320 a light reflector also includes fabricating 324 a light reflector support structure monolithic with the optical semiconductor.structure add adjacent to the light-reflective surface, for example, monolithic with the optical semiconductor structure. Air-bridge processing, such as that presented in Chapter 15 of "Modern Gallium Arsenide Processing Methods," second edition, ISBN 0-89006-343-5, written by Ralph Williams and published by Artech House, may be used to construct the light reflector 110.

Figure 4:
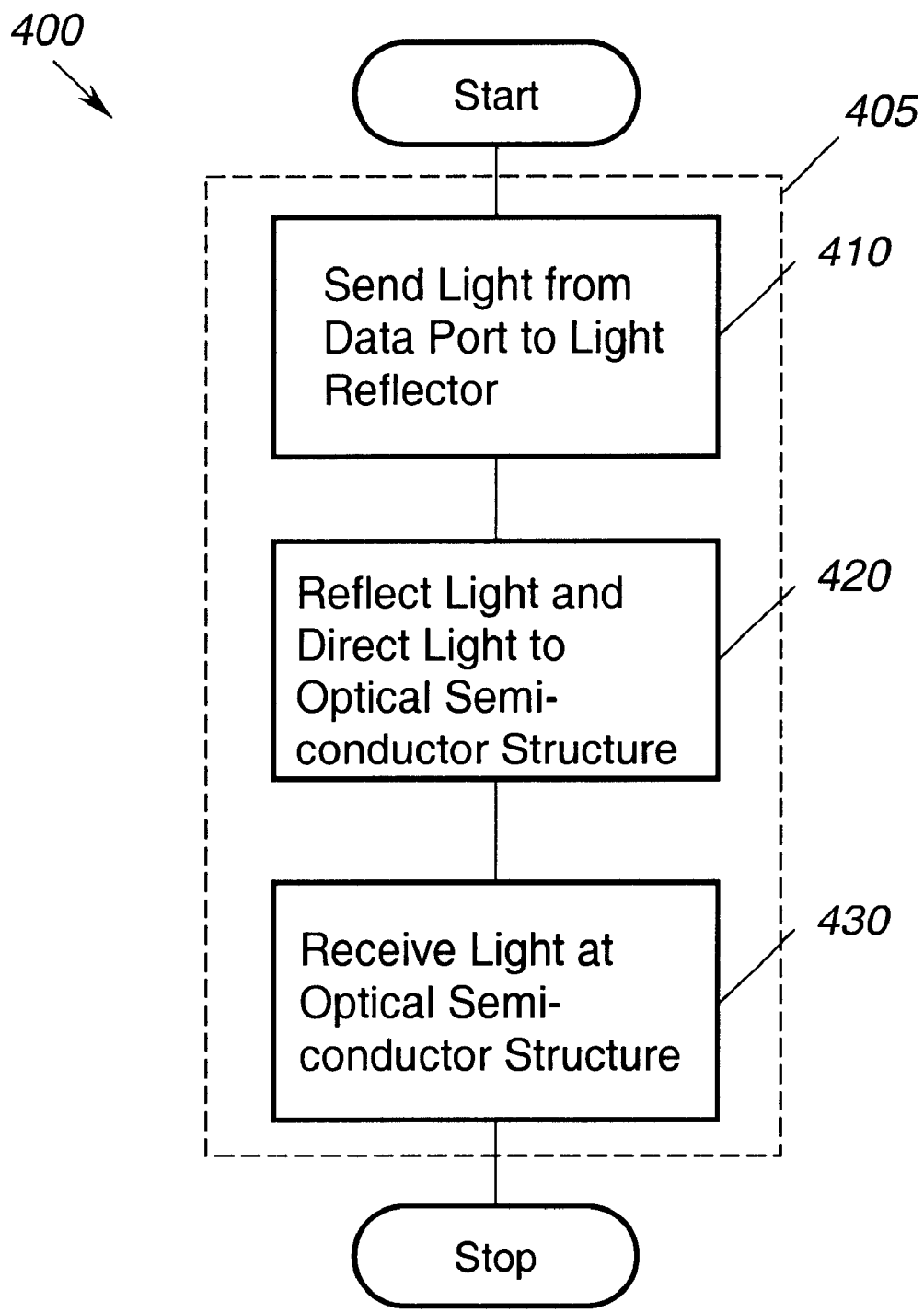
FIG. 4 illustrates a method for interfacing a data port and an optical semiconductor structure.

Referring now to FIG. 4, that figure illustrates a method 400 for interfacing a data port and an optical semiconductor structure. The method 400 includes coupling 405 light between the data port and the optical semiconductor structure by directing light using a reflector monolithic with the optical semiconductor structure. In particular, coupling 405 light between the data port and the optical semiconductor structure includes transmitting 410 light from the data port to a light reflector that is monolithic with the optical semiconductor structure, followed by include directing 420 the light received from the data port to the optical semiconductor structure with the monolithic light reflector. The light is received at the optical semiconductor structure. Alternatively, coupling 405 light between the data port and the optical semiconductor structure may include directing light from the optical semiconductor structure to the data port using a light reflector monolithic with the optical semiconductor structure. In other words, the monolithic light reflector may be used to both receive and transmit information.

The present optical semiconductor device includes an optical semiconductor structure and a light reflector monolithic with the optical semiconductor structure. The semiconductor device is robust, low-profile, cost-effective, highly manufacturable, and easy to use, particularly in comparison to prior reflector structures.

While particular elements, embodiments and applications of the present invention have been shown and described, it will be understood that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. An optical semiconductor device, comprising:
   an optical semiconductor structure having a top surface through which light is transmitted in a direction approximately normal to the top surface; and
   a light reflector for coupling the optical semiconductor structure to an optical data port having an optical axis generally parallel to the top surface, the light reflector being monolithic with the optical semiconductor structure and disposed to reflect light transmitted in either direction, between the top surface and the optical data port, wherein the light reflector functions in a selected one of two modes, including a first mode to converge light directionally to the top surface of the semiconductor structure and a second mode to receive and reflect light diverging from the top surface of the semiconductor structure.

2. The optical semiconductor device of claim 1, wherein the light reflector comprises a metallic reflective surface.

3. The optical semiconductor device of claim 1, wherein the light reflector comprises a metallic reflective surface supported by a metallic support.

4. The optical semiconductor device of claim 1, wherein the light reflector is shaped substantially quarter-spherically.

5. The optical semiconductor device of claim 1, wherein the optical semiconductor structure comprises a top-illuminated optical semiconductor structure, and the light reflector is disposed to direct light to the top surface of the top-illuminated optical semiconductor structure.

6. The optical semiconductor device of claim 1, wherein the optical semiconductor structure comprises a top-illuminated semiconductor light source, and the light reflector reflects light from the top surface into the data port.

7. The optical semiconductor device of claim 6, wherein the light reflector comprises a metallic reflective surface supported by a metallic support.

8. The optical semiconductor device of claim 1, wherein the optical semiconductor structure comprises a top-illuminated semiconductor photodetector, and the light reflector reflects light from the data port onto the top surface.

9. A method for fabricating an optical semiconductor device, the method comprising:

fabricating a top-illuminated optical semiconductor structure having a top surface through which light is to be transmitted in a direction approximately normal to the top surface; and fabricating a light reflector for coupling light to an optical data port having an optical axis generally parallel to the top surface, wherein the light reflector is fabricated to be monolithic with the optical semiconductor structure and is disposed to reflect light transmitted in either direction between the top surface and the optical data port, and wherein the light reflector is contoured to converge light from the optical data port directionally to the top surface of the optical semiconductor structure.

10. The method of claim 9, wherein fabricating a light reflector comprises fabricating a substantially quarter-spherical light reflector monolithic with the optical semiconductor structure.

11. The method of claim 9, wherein fabricating a light reflector comprises fabricating a metallic light reflector monolithic with the optical semiconductor structure.

12. The method of claim 9, wherein fabricating a light reflector comprises air-bridge fabricating a metallic light reflector.

13. A method for interfacing a data port and a top-illuminated optical semiconductor structure, the method comprising:

receiving at a light reflector, light from one of a data port and an optical semiconductor structure; and reflecting the received light to the other of the data port and the optical semiconductor structure;

wherein the optical semiconductor structure has a top surface through which light is transmitted along an axis generally normal to the top surface;

and wherein the data port has an optical axis that is generally parallel to the top surface;

and wherein the light reflector is monolithic with the optical semiconductor structure.

14. The method of claim 13, wherein reflecting comprises reflecting light from the data port to the optical semiconductor structure.

15. The method of claim 14, wherein reflecting comprises reflecting laterally received light from the data port vertically to the optical semiconductor device structure.

16. The method of claim 13, wherein reflecting comprises reflecting light emitted from the optical semiconductor structure to the data port.

17. The method of claim 16, wherein reflecting comprises reflecting vertically emitted light from the optical semiconductor structure to the data port.

* * * * *